(12) United States Patent
Yeh et al.

(10) Patent No.: US 7,510,940 B2
(45) Date of Patent: Mar. 31, 2009

(54) METHOD FOR FABRICATING DUAL-GATE SEMICONDUCTOR DEVICE

(75) Inventors: Chen-Nan Yeh, Hsin Chih (TW); Mong Song Liang, Hsin-Chu (TW); Ryan Chia-Jen Chen, Chiaya (TW); Yuan-Hung Chiu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 96 days.

(21) Appl. No.: 11/707,490

(22) Filed: Feb. 16, 2007

(65) Prior Publication Data

US 2008/0197420 A1   Aug. 21, 2008

(51) Int. Cl.
   *H01L 21/336* (2006.01)
(52) U.S. Cl. .................. 438/283; 257/E21.623
(58) Field of Classification Search .......... 438/199, 438/157, 230–233, 283, 938; 257/369, E21.623, 257/E21.637, E21.635
See application file for complete search history.

(56) References Cited

U.S. PATENT DOCUMENTS

| 6,905,923 B1 | 6/2005 | Paton et al. |
| 6,946,350 B2 | 9/2005 | Lindert et al. |
| 6,974,737 B2 * | 12/2005 | Snyder et al. ............... 438/199 |
| 7,195,969 B2 * | 3/2007 | Chan et al. .................. 438/230 |

OTHER PUBLICATIONS

Luo, Z., et al., "Design of High Performance PFETs with Strained Si Channel and Laser Anneal," 2005 IEEE, 4 pages.

* cited by examiner

*Primary Examiner*—David Vu
(74) *Attorney, Agent, or Firm*—Slater & Matsil, L.L.P.

(57) ABSTRACT

A method for fabricating a dual-gate semiconductor device. A preferred embodiment comprises forming a gate stack having a first portion and a second portion, the first portion and the second portion including a different composition of layers, forming photoresist structures on the gate stack to protect the material to be used for the gate structures, etching away a portion of the unprotected material, forming recesses adjacent to at least one of the gate structures in the substrate upon which the gate structures are disposed, and forming a source region and the drained region in the respective recesses. The remaining portions of the gate stack layers that are not a part of a gate structure are then removed. In a particularly preferred embodiment, an oxide is formed on the vertical sides of the gate structures prior to etching to create the source and drain regions.

14 Claims, 11 Drawing Sheets

US 7,510,940 B2

METHOD FOR FABRICATING DUAL-GATE SEMICONDUCTOR DEVICE

TECHNICAL FIELD

The present invention relates generally to a method for fabricating a semiconductor device, and more particularly to a method for efficiently fabricating a dual-gated semiconductor device, especially one in which the two gate structures have different compositions.

BACKGROUND

Semiconductor devices are typically fabricated using a process that involves a number of sequential process steps. Each step in the sequence represents an additional expense for the overall manufacturing process, and therefore there is consistently a need for new methods that can make the fabrication of the semiconductor devices more efficient, without sacrificing the quality and reliability of the resulting devices. This is especially the case in the recent past, as market demands have pushed for smaller and more compact components that nevertheless have more functionality than previous designs.

A semiconductor device, generally speaking, is an electrical component, or set of components, fabricated onto a substrate that is made of a semiconductor material such as silicon. Examples of such devices include diodes, capacitors, transistors, and combinations of these basic components. In most modern semiconductor devices, a great many very small components are fabricated onto a wafer. A wafer is a thin, usually circular slice of semiconductor material that is used as a substrate for fabrication. The wafer in most cases is divided up into a number of dice, which after fabrication will be separated and packaged for individual use. Each die, after packaging, will form a component part of an electrical appliance such as a personal computer, a cellular telephone, or a personal digital assistant. These individual component parts are often called chips. Many recently-developed chips may even contain multiple dice, with each die performing its own function either independently or in cooperation with the others. In order to accomplish these functions, the individual semiconductor devices formed on each chip are interconnected to form integrated circuits (ICs). Access points such as bond pads are available on each die for terminating the leads or wires to connect the ICs on the chip with other, external components of the electrical appliance where the chip is installed.

To begin the manufacture of a semiconductor device, a thin slice of silicon or other suitable material is formed from an ingot. Selectively implanting areas on the surface of this wafer substrate with impurities such as boron or phosphorous ions give portions of the silicon wafer their semiconducting properties. These properties are, of course, very important to the operation of the device. In a transistor, for example, a source region and a drain region are formed in a spaced apart relationship at the surface of the substrate in this manner. The space between the source region and the drain region is called a channel, and an electrical current may flow through the channel under certain conditions. In the case of a transistor, a gate placed over the channel is electrically charged in order to start the flow of electrical current.

The gate, generally speaking, is formed of a conductive gate electrode that is separated from the channel region by a thin layer of dielectric material, often referred to as the gate dielectric. An example is shown in FIG. 1. FIG. 1 is a side (elevation) view illustrating in cross-section an exemplary transistor 10. Transistor 10 includes a gate structure 11, which is formed on substrate 12. Gate structure 11 includes gate electrode 15, which is separated from substrate 12 by gate dielectric 14. Disposed above the gate electrode 15 is a contact region 16, through which reliable electrical connections may be made. In many applications, gate electrode 15 is made of a poly (polycrystalline silicon) material and contact region 16 is formed of a metal such as gold or copper. On either side of the gate structure 11 is a spacer 17 to protect the gate electrode physically and electrically, and also to aid in the proper creation of the source and drain regions. On one side and adjacent to the gate structure 11, a source region 18 has been formed in the substrate 12. On the other side and adjacent to the gate structure 11 a drain region 19 has also been formed in substrate 12. Channel 20 is the substrate region disposed between source region 18 and drain region 19. Electrical contacts 21 and 22 have been formed on source region 18 and drain region 19, respectively.

To form a semiconductor device such as transistor 10 illustrated in FIG. 1, layers of insulating and conductive material are sequentially formed on either the substrate or previously-formed layers. Each layer may be selectively etched away to form the structures needed for the fabrication of each separate component. Naturally, a large number of such components may be fabricated at the same time. Selective etching, or other types of material removal, may be performed by exposing certain regions of the wafer to an appropriate solvent or other removal mechanism for a predetermined amount of time. During etching, regions that are to remain may be protected by a structure that is resistant to the removal process being implemented at that stage. This protective process is often called photolithography, and the resistant structure is made of a material called photoresist. The photoresist is normally formed into a single layer that is then patterned into individual structures. This may be achieved by selectively exposing the photoresist to light energy at certain frequency and intensity. This exposure causes a physical change in either the exposed or unexposed portions of the photoresist (depending on the type used), and the undesired photoresist regions may then be washed away by a solvent. After the etching process is complete, the remaining photoresist may be removed by another solvent selected for its capability to perform this function. The photoresist structures may also be removed by a process called ashing, which involves dissolving the photoresist by oxidation.

An example fabrication process is shown in FIG. 2. FIG. 2 is a flow diagram illustrating an exemplary method 30 of fabricating a semiconductor device, in this case the transistor 10 shown in FIG. 1. At START it is assumed that all materials and equipment necessary for performing the method are available and operational. The method begins with forming an oxide layer on the substrate (step 32). A poly layer for the gate electrode is then formed (step 34) as well. A photoresist layer is then formed (step 36) and patterned (step 38) so that a photoresist structure protects the region where the gate structure will be formed. An etching step is now performed (step 40), leaving the gate structure of the substrate, and the remaining photoresist removed (step 42). The source region and the drain region may now be partially formed by ion implantation (step 44), sometimes called doping, in many cases after adding additional temporary or permanent protective structures (step not shown).

In this exemplary method, a dielectric layer is then deposited (step 46) and selectively etched (step 48) to form the spacers for the gate structure. An additional ion implantation (step 50) forms the deeper part of the source region and drain region according to the process this example (see FIG. 1). An electrical contact region may then be formed on top of the gate electrode at this time (step 52), although the individual steps that may be involved are not separately shown in FIG. 2. At this point the transistor 10 has been formed and fabrication may continue with the addition of additional material layers and the formation of additional devices.

Naturally, FIG. 2 represents only one of many ways of forming transistors and similar devices. Fabrication techniques and materials have increased in sophistication in recent years. These advances have often been made necessary by the drive for making ever-smaller devices. At times these more sophisticated techniques and new materials are needed to make fabrication of such tiny devices feasible, and at other times they are necessary to make the devices function as intended. Expense is also an issue, and improvements are needed so that even more capable devices can be made at a lower cost.

New components have also been developed for these reasons, that is, to aid in the fabrication process, to reduce expense, and to improve the capabilities of the device for which they are ultimately to be a component part. One such innovation is a CMOS (complementary metal oxide semiconductor) device. A CMOS device includes two types of transistors that work together. Although similar in structure, the NMOS transistor and the PMOS transistor that make up a CMOS device are slightly different in composition. This can pose a challenge during fabrication, where identical or nearly identical devices contribute to manufacturing efficiencies that are lost when the differentiation between neighboring components must be achieved.

One such device is illustrated in FIG. 3. FIG. 3 is a side view illustrating in cross-section an exemplary CMOS semiconductor device 100. Semiconductor device 100 has two gates, including one associated with NMOS device 110 and one associated with PMOS device 150. Exemplary CMOS device 100 is formed on a substrate 101, which in this case is a p-doped silicon substrate. For this reason an n-well 102 has been formed in substrate 101 to accommodate the PMOS device 150. Isolation structure 104 separates the PMOS device 150 from the NMOS device 110, and isolation structures 103 and 105 separate a respective one of these devices from others (not shown) adjacent to them. Note that although only a single CMOS device is shown in FIG. 3, there are likely to be a great many of them disposed on the substrate, usually in addition to other types of devices as well.

In this example, NMOS device 110 includes a gate structure 120 formed on the substrate 101. Adjacent to and on respective opposing sides of gate structure 120 are source region 112 and drain region 114, also formed in the substrate 101, defining channel 113. The NMOS gate structure 120, disposed over channel 113, includes a gate electrode 124 that is physically separated from the substrate 101 by a gate oxide 122 (sometimes referred to as an oxide layer within the gate structure 120). Spacers 126 and 127 are formed on either side of the gate structure 120, are frequently formed of an oxide material but could include a nitride as well. Contact 129 is formed atop gate electrode 124 and facilitates electrical connections to it.

Similarly, PMOS device 150 of CMOS device 100 features a PMOS gate structure 160 disposed over n-well 102 of substrate 101. On either side of gate structure 160 is disposed, respectively; source 152 and drain 154, which together define channel 153. The gate structure 160 includes a gate electrode 164 that is physically separated from n-well 102 by an oxide layer 162. Spacers 166 and 167 are formed on either side of gate structure 160, and contact 169 is formed atop gate electrode 164. The source and drain regions of CMOS device 100 are also accessed electrically through contacts of metal or some other conductor. Contact 130 is formed over the source region 112 of NMOS device 110, and in this example is connected to ground. Contact 170 similarly is disposed over drain region 154 of PMOS device 150, and connects it to a positive voltage source. Contact 180, disposed above isolation structure 104 is in contact with both the drain region 114 of NMOS device 110 and with the source region 152 of PMOS device 150, enabling device 100 to function as a CMOS device.

The fabrication process for CMOS device 100 is similar though not identical to that described above in reference to FIG. 2. Note that both of the gates structures 120 and 160 appear in FIG. 3 to be nearly identical, which may in fact be the case in some applications. In many recent applications, however, it has been found that overall improvement may be obtained by modifying only one of the two devices (from the configuration shown in FIG. 3), or by modifying both of them, but in different ways. As should be apparent, this may pose additional challenges in the fabrication process. Some modifications, for example, may be beneficial when used in PMOS devices, but detrimental in NMOS devices. Similar considerations arise in other applications where two (or more) different structures must be formed. The challenge arises to manufacture both devices in a dual-gate semiconductor device to accommodate these differences without having to make each of the different devices in a completely separate sequence of steps. Needed then is a method for creating dual-gate semiconductor devices efficiently. The present invention provides just such a solution.

SUMMARY OF THE INVENTION

These and other problems are generally solved or circumvented, and technical advantages are generally achieved, by preferred embodiments of the present invention which are directed to a dual-gate semiconductor device such as a CMOS device having differently-constructed gates.

In accordance with a preferred embodiment of the present invention, a method for fabricating a semiconductor device comprises forming a gate stack out of which the two or more gates are to be formed, creating etch-resistant structures to protect the prospective gate regions, performing an etching operation that forms a gate structure out of one portion of the gate stack, and partially forming another gate structure in a different portion of the gate stack layer where a metal layer has been inserted. A layer of oxide or other dielectric material is then formed on the vertical sides, and particularly on the poly portion, of each of the respective gates structures. Another etching process is then performed to remove those portions of the metal layer that will not be part of one of the gate structures itself, and to form recesses in the substrate adjacent to the other gate structure. These recesses are then filled with a material, such as silicon germanium or silicon carbon, preferably by epitaxial growth to create a strained silicon region, these regions to form the source and drain associated with the adjacent gate structure. In a CMOS device, either the PMOS or the NMOS transistor may be the portion of the device including the strained source and drain regions, although the exact composition of these regions will vary depending on the portion of the CMOS device they are used. The source region and drain region for the other transistor may be formed in any logically-appropriate time.

In accordance with another preferred embodiment of the present invention, a dual-gate semiconductor device comprises a first transistor and a second transistor, the two devices being electrically coupled in some manner. The first transistor includes a dielectric layer that has been formed on a substrate, a metal layer that has been formed on the dielectric layer, and a poly gate electrode that has been formed on the metal layer. The dielectric layer is preferably formed of a high-k material. The second transistor includes a second dielectric layer formed on the substrate adjacent to a strained source region and drain region. The strained source and drain regions are preferably formed by epitaxial growth of silicon and either germanium or carbon, depending on the function of the second transistor will perform.

An advantage of a preferred embodiment of the present invention is that it permits the efficient fabrication of a semiconductor device that includes two or more gates that are different from each other.

A further advantage of a preferred embodiment of the present invention is that the poly gate electrodes associated with each of the different gates may be fabricated with a relatively-thinner profile, which facilitates the advantageous application of a later-formed stress layer.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual-gate CMOS (complementary metal-oxide semiconductor) device. The invention may also be applied, however, to other semiconductor devices that use two or more gates that differ in composition with respect to each other but that have at least some fabrication steps in common. In other words, the term "dual-gate" as used herein does not imply that there are only two different types of gates; the method may be used where there are more than two. And the invention is not limited in application to those devices that are ordinarily considered CMOS devices, but may be used in other applications as well.

The present invention, then, is directed to a method for fabricating a semiconductor device, for example a dual-gate device such as a CMOS transistor. According to a preferred embodiment, the present invention is such a device having a PMOS component with a strain-engineered source and drain region. The method for fabricating this device will now be explained in more detail.

Figure 1:
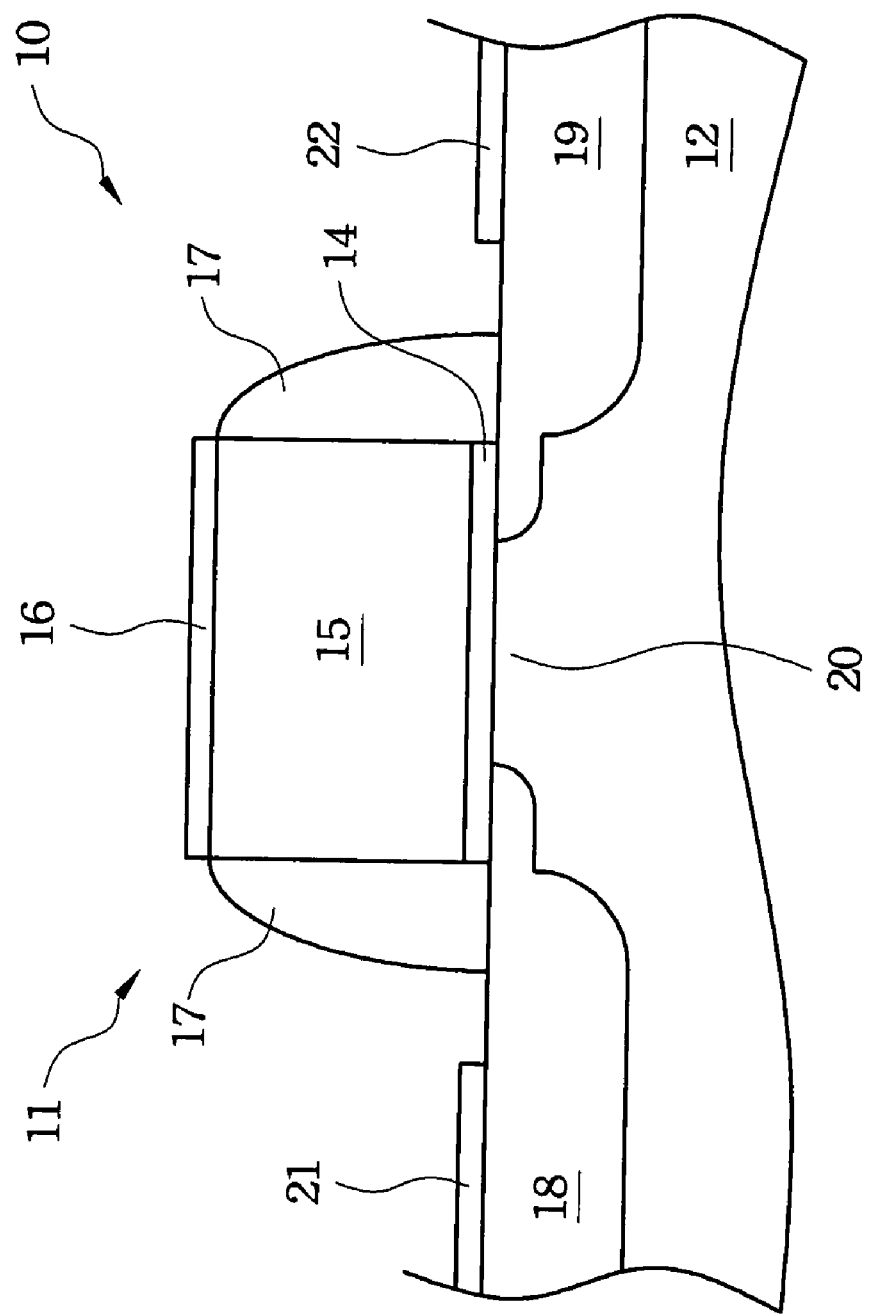
FIG. 1 is a side (elevation) view illustrating in cross-section an exemplary transistor.
Figure 2:
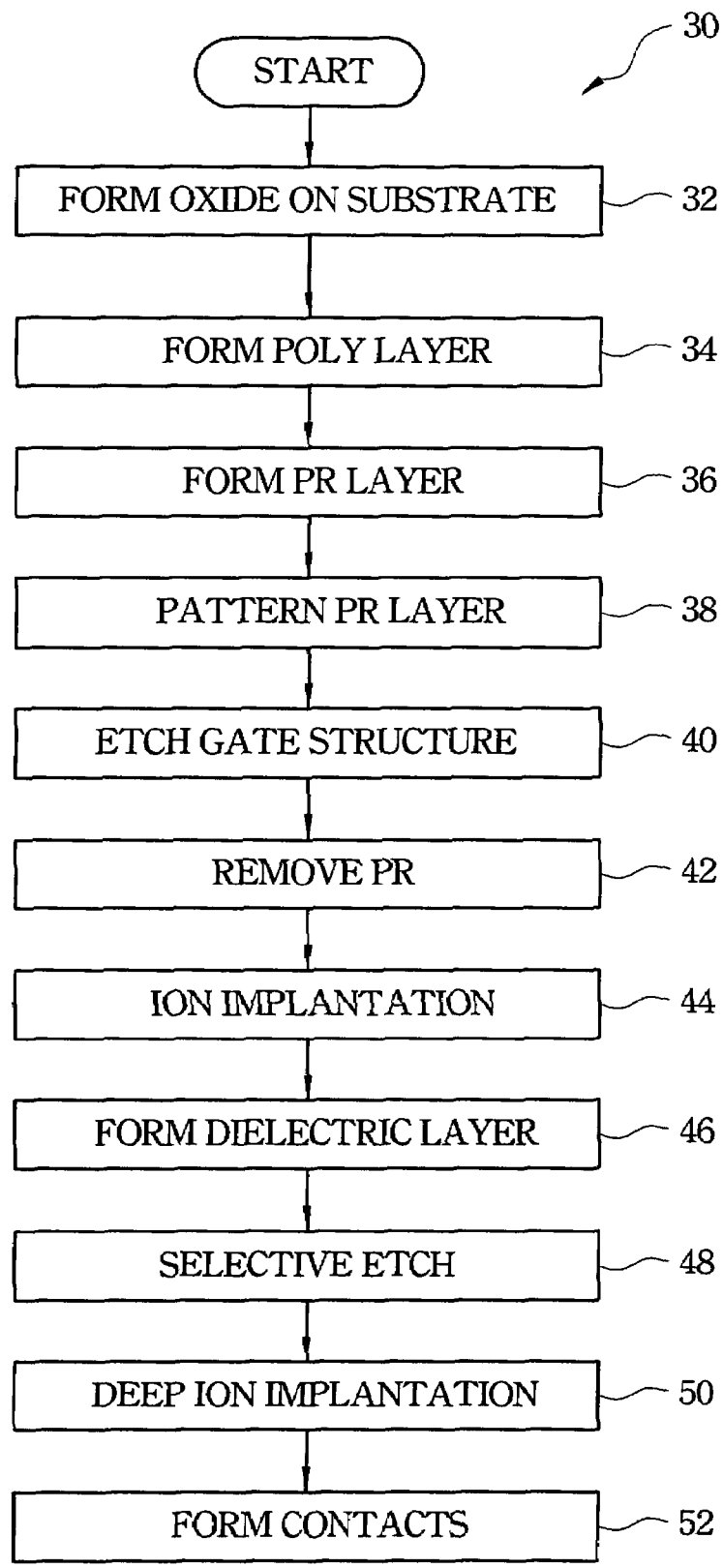
FIG. 2 is a flow diagram illustrating an exemplary method of fabricating a semiconductor device, in this case the transistor shown in FIG. 1.
Figure 3:
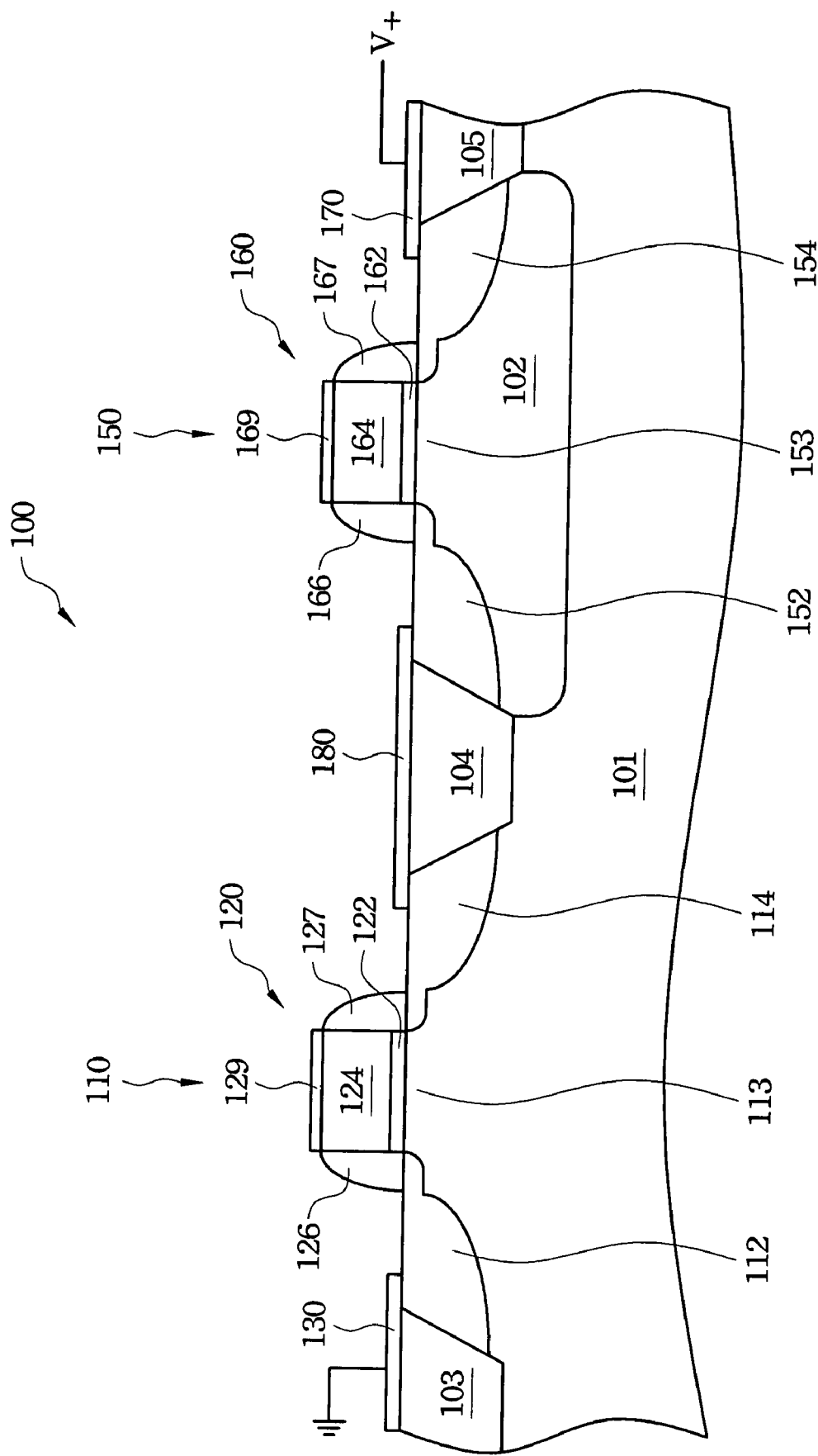
FIG. 3 is a side view illustrating in cross-section an exemplary CMOS semiconductor device.
Figure 4:
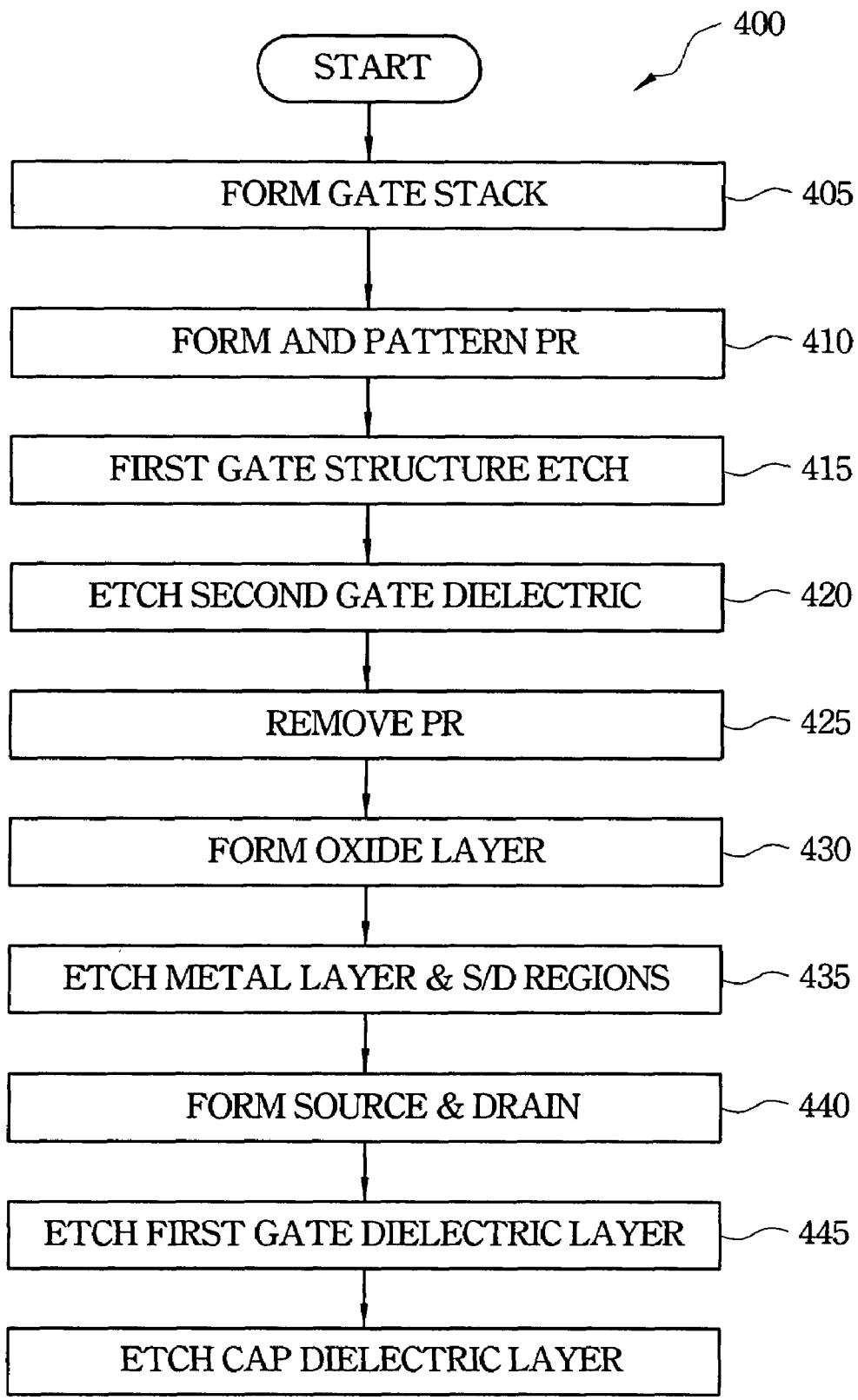
FIG. 4 is a flow diagram illustrating a method of fabricating a CMOS transistor device according to an embodiment of the present invention.
Figure 5:
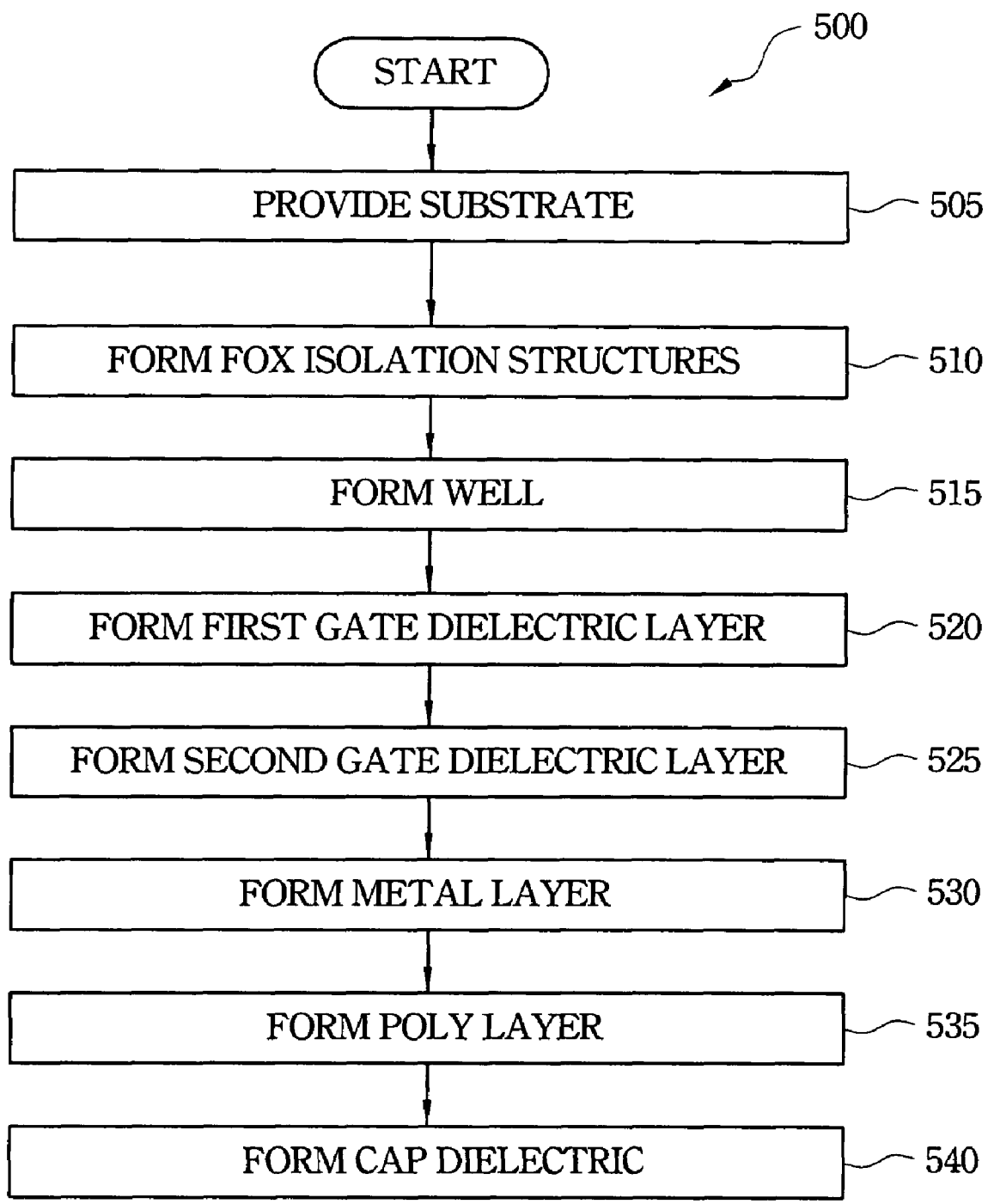
FIG. 5 is a flow diagram illustrating a method of forming a gate stack for the fabrication of a CMOS transistor device according to an embodiment of the present invention.

FIG. 4 is a flow diagram illustrating a method 400 of fabricating a CMOS transistor device according to an embodiment of the present invention. At START, it is presumed that all materials and equipment necessary for performing the method are available and operational. The method may then begin with the formation of a gate stack (step 405). As used herein, the term "gate stack" refers generally to a plurality of layers of various materials that are assembled to be used in the formation of a dual-gate semiconductor device. Preferably, the stack is formed so that both the gates of the dual-gate device may be formed from it, that is, so that completely separate series of operations are not required. An exemplary method 500 of forming a gate stack is shown in FIG. 5 and described below. Other methods of forming the gate stack may be used as well.

After the gate stack is formed, a photoresist layer is formed and patterned (step 410). As should be apparent, the photoresist structures that are created at this time are preferably used to protect the materials that will form each gate structure, and leave exposed those portions that are to be removed. Accordingly, once the photoresist structures are in place, the etching of the gate structures may begin. In this embodiment, the poly layer of the gate stack is etched away (step 415), leaving only those portions that will form the respective gate electrodes. In this step, unprotected portions of a cap dielectric layer, if present, are also etched away.

In the embodiment of FIG. 4, this etching step leaves a first gate structure portion disposed upon a gate metal layer, which is itself separated from a substrate by a first gate dielectric layer. This first gate structure will serve as the NMOS portion of the CMOS device. For the other, that is, second gate structure, which will become the PMOS portion of the CMOS device, a second gate structure portion is separated from the substrate by a second gate dielectric layer. This second gate dielectric layer is then etched away (step 420), except for the gate-structure portion, to leave the second gate structure disposed directly above the substrate. Note that in a preferred alternate embodiment (not shown), the etch steps 415 and 420 may be performed using a HBr and a $C_xF_y$ plasma etch respectively. The remaining photoresist may then be removed, for example by ashing (step 425).

At this point, according to the embodiment of FIG. 4, and oxide layer is formed (step 430), preferably by oxygen plasma oxidation, covering the sides of the respective gate electrodes, that is, of at least the exposed poly portions of the first gate structure and of the second gate structure. An etching step is then performed (step 435) to remove those portions of the metal layer that are not part of the first gate structure. The first gate structure will, at this stage, be disposed directly on the first dielectric layer. Also in this step, the PMOS source region and drain region recesses are etched from the substrate on either side of the second gate structure. (As should be apparent, at least a portion of the oxide layer covering the substrate must also be removed prior to forming the source and drain recesses.) Note that the depth and extent of these recesses will vary from application to application. In one embodiment, this etching step is performed using fluorinated and chlorine gas mixture including $CH_xF_y$ (for example Freon-23), $SF_6$ (sulfur hexafluoride), and $Cl_2$.

In this embodiment, the PMOS source and drain are now formed (step 440). This is preferably accomplished using an epitaxial growth process to form silicon germanium (SiGe) source and drain regions. Other materials may be used as well. The source and drain regions are doped (step not shown) appropriately to their intended function, either during the growth step or at a later time. Those portions of the first (high-k) dielectric layer lying outside the first gate structure are now removed (step 445), for example using a dry etch process. The remaining portions of the cap dielectric layer are also removed (step 450), for example by a wet etch process. Although not shown in FIG. 4, the fabrication process may continue with the addition of an additional dielectrics layer or etch stop layer, and metal contacts appropriate to the device. In addition, it is noted that in an alternate embodiment (not shown), the high-k gate dielectric and metal layer may instead be implemented on the PMOS side, with the strained source and drain regions formed (for example, of SiC) on the NMOS side in a method that is similar to the one described above. The high-k dielectric and metal combination are expected to improve leakage and gate-capacitance performance in addition to facilitating performance of the method of the present invention, and this benefit may be used for either gate as a matter of design choice. Finally, note that the steps of the method of the present invention may be performed in any logically-permissible order, and in many cases additional steps inserted, without departing from the spirit of the invention.

As mentioned above, there may be a number of ways to initially form the gate stack for use in executing the method of FIG. 4. One such method is illustrated in FIG. 5. FIG. 5 is a flow diagram illustrating a method 500 of forming a gate stack for the fabrication of a CMOS transistor device according to an embodiment of the present invention. This gate stack formed by method 500 may, for example, serve as the gate stack formed in the performance of method 400 (at step 405). Referring to FIG. 5, at START it is presumed that all materials and equipment necessary for performing the method are available and operational.

The method then begins with providing a substrate (step 505) on which the device may be fabricated. The substrate may be made of silicon or some other suitable material. In this embodiment, the substrate has been doped with phosphorus ions (step not shown) to create an n-channel type semiconducting material. A number of field oxide (FOX) isolation structures may then be formed (step 510) to separate the individual component devices. As this is a CMOS device, a p-well is then formed (step 515) in the substrate as a base for the PMOS portion of the device. In an alternate embodiment, the substrate may be treated to create a p-type material, and an n-well formed for the NMOS portion of the device. In either case, the resulting semiconductor device now has what can be considered an NMOS portion and a PMOS portion, and they will be sometimes referred to as such herein. Of course, on any particular wafer substrate, there may be thousands of such devices being constructed simultaneously. Only two gates, in this embodiment for forming a single CMOS device, are shown here for simplicity.

A gate dielectric layer is then formed (step 520), covering only the PMOS portion of the device. This may be done by covering the substrate with the dielectric material, then using a photoresist structure over the PMOS portion so that the remainder of the gate dielectric layer may be etched away (steps not individually shown). Note that he gate dielectric layer associated with the PMOS portion of the CMOS device is referred to above (in reference to FIG. 4) as the second gate dielectric. The first gate dielectric, disposed in the NMOS portion of the device is then formed (step 525). The first gate dielectric is preferably formed of a high-k material, for example $HfO_2$ (hafnium oxide) or $ZrO_2$ (zirconium oxide). As used herein, a high-k material has a dielectric constant (k) greater than that of $SiO_2$ (silicon dioxide), which is about 3.9, though significantly higher values are preferred in most applications. $ZrO_2$, for example, has a dielectric constant of about 12.5, and $HfO_2$ has a dielectric constant of about 20 or higher. In this embodiment, a metal layer is then formed (step 530) over the first dielectric layer, that is, in the NMOS portion of the device. The metal and first dielectrics layers on PMOS side are then removed by dry and wet etching respectively by covering NMOS with photoresist. At this point in the process, the first gate dielectric layer and overlying metal layer have been formed on the NMOS side of the device, while a second gate dielectric layer has been formed on the PMOS side of the device. A poly layer that will be used to form both gate electrodes is then formed (step 535) over the entire structure. Finally, a cap dielectric layer is formed (step 540) over the poly layer.

Figure 6A:
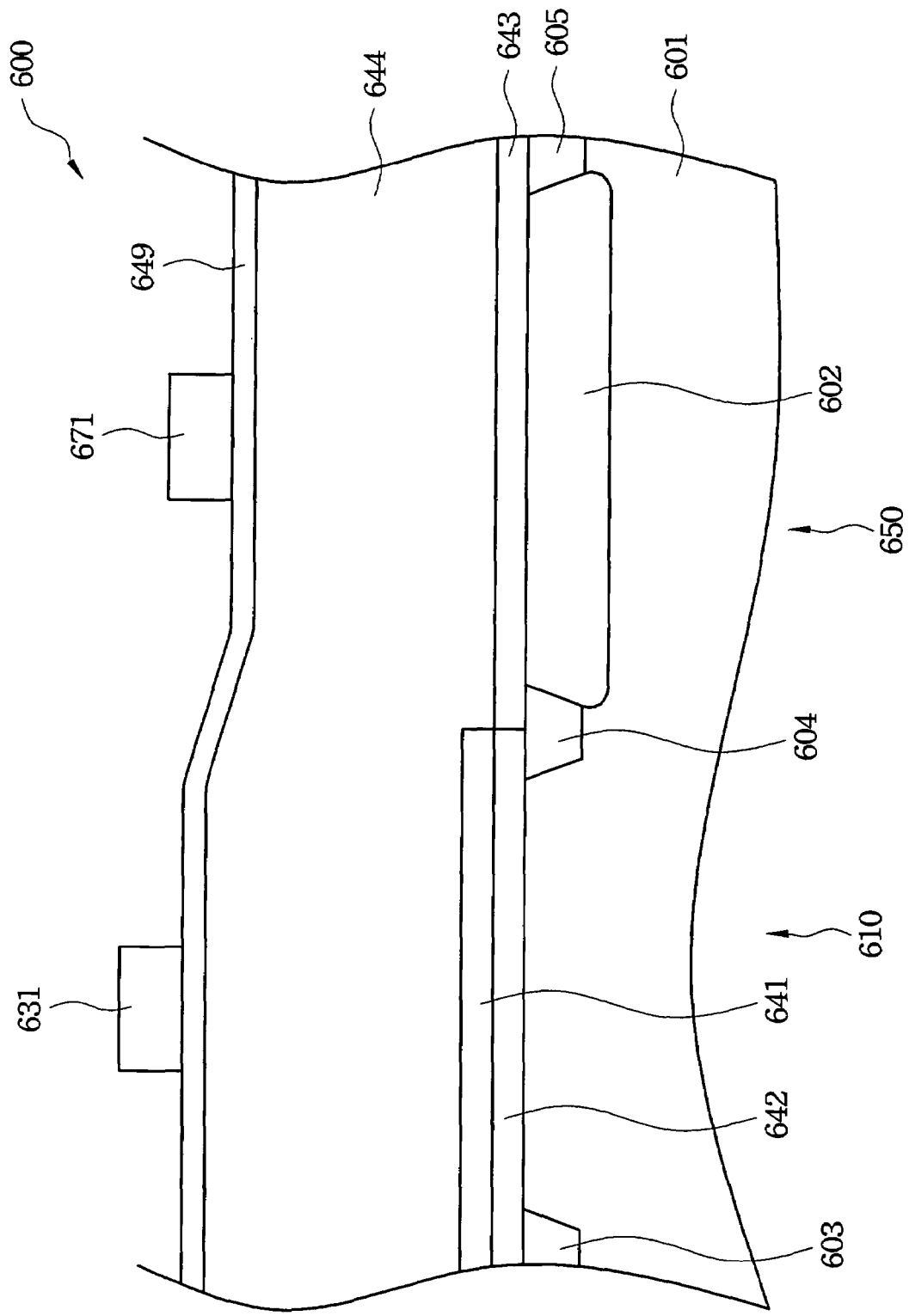
FIGS. 6a through 6f are a sequence of side views illustrating in cross-section the configuration of a semiconductor device at selected stages of fabrication according to an embodiment of the present invention.
Figure 6B:
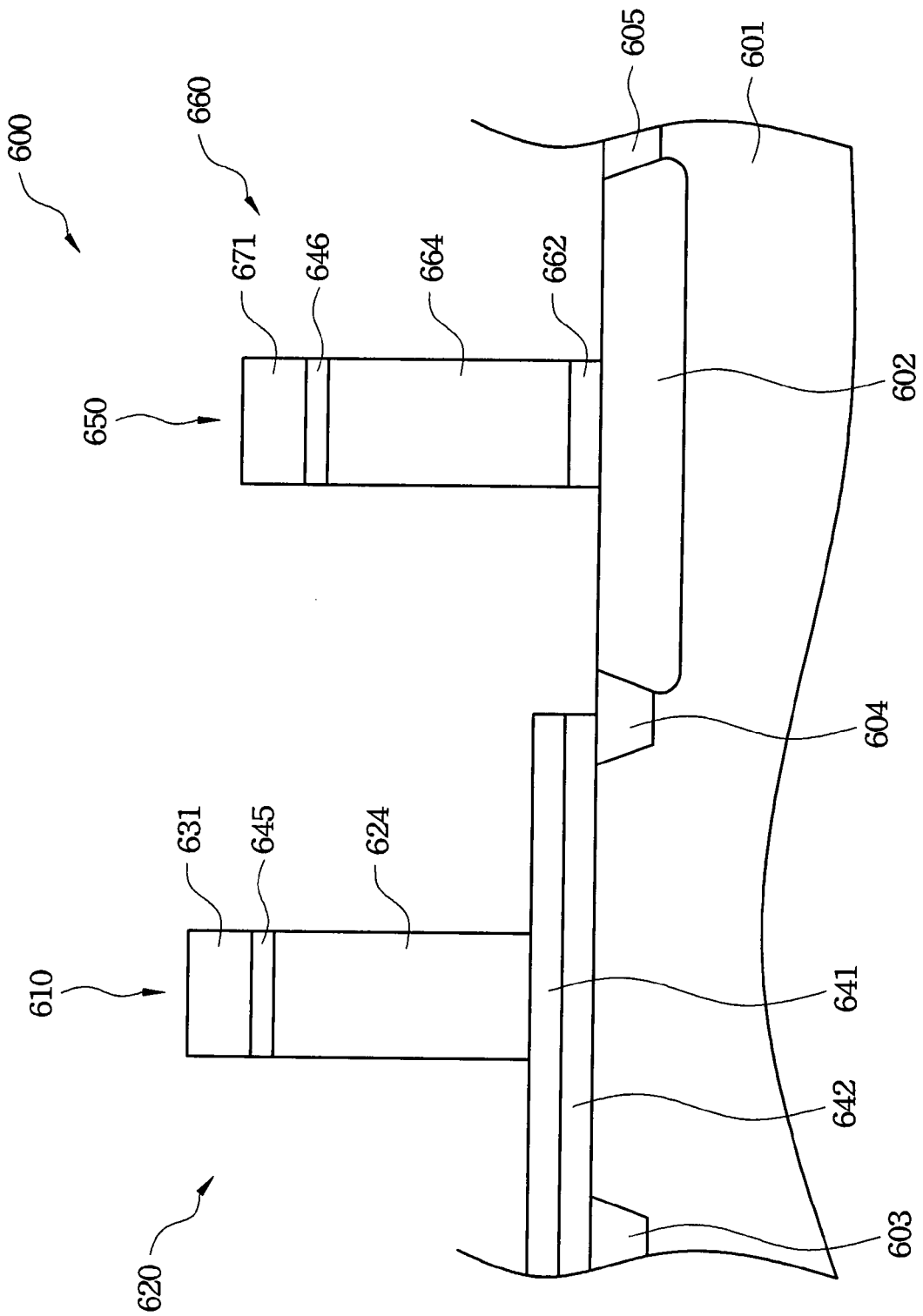

A method of fabricating a semiconductor device according to an embodiment of the present invention is also illustrated in FIGS. 6a through 6f. FIGS. 6a through 6f are a sequence of side views illustrating in cross-section the configuration of a semiconductor device 600 at selected stages of fabrication according to an embodiment of the present invention. In this embodiment, a gate stack is first formed, for example using the method generally set forth in reference to FIG. 5. Similarly to the methods described above, a photoresist layer is formed and patterned to produce photoresist structures 631 and 671, as shown in FIG. 6a, in preparation for etching the gate structures. Note that the gate stack features a high-k first dielectric layer 642 formed only in the NMOS region 610 of CMOS device 600, and the first metal later 641 formed over the first dialectic layer 642. A second gate dielectric layer 643 is formed over the PMOS portion 650 of the device 600. The PMOS portion 610 and the NMOS portion 650 are separated at the surface of the substrate by an isolation structure 604.

Also visible in FIG. 6a is the poly layer 644 that overlies the first metal layer 641 and the second gate dielectric layer 643, as well as the cap dielectric layer 649 that overlies the poly layer 644. As mentioned above, the photoresist structures 631 and 671 are patterned on the top of the gate stack, in this embodiment directly over cap layer 649. An etching step to partially form the gate structures for CMOS device 600 can then be performed, resulting in the configuration shown in FIG. 6b. As can be seen in this figure, the gate structures 620 and 660 have been etched away to expose the surface of the first metal layer 641 on the NMOS side, and the surface of the substrate 601 on the PMOS side, except of course where the remainder of these layers form part of the respective gate structures themselves. As should be apparent, n-well 602, formed in substrate 601 on the PMOS side 650, is the portion of the substrate now exposed.

Figure 6C:
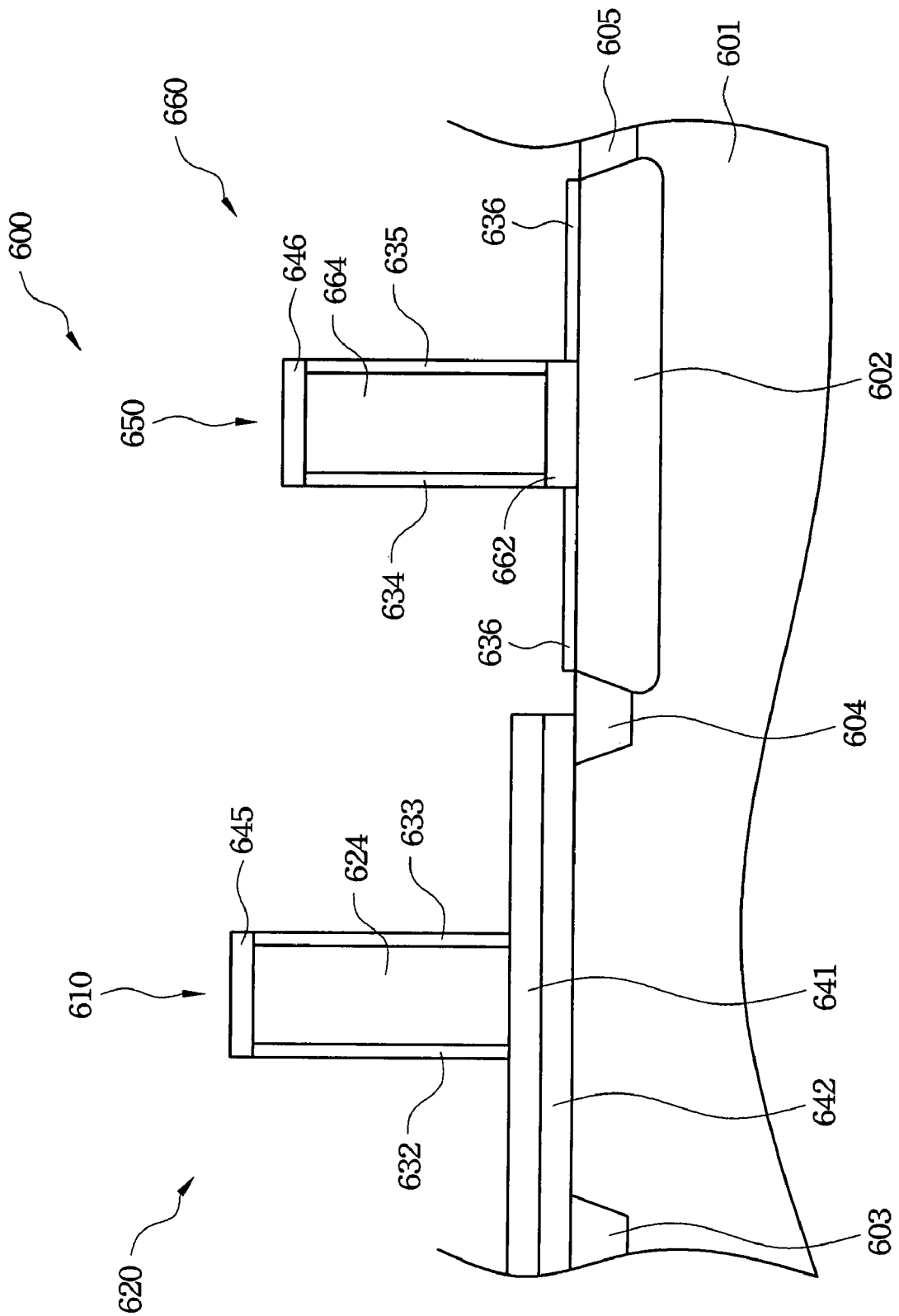
Figure 6D:
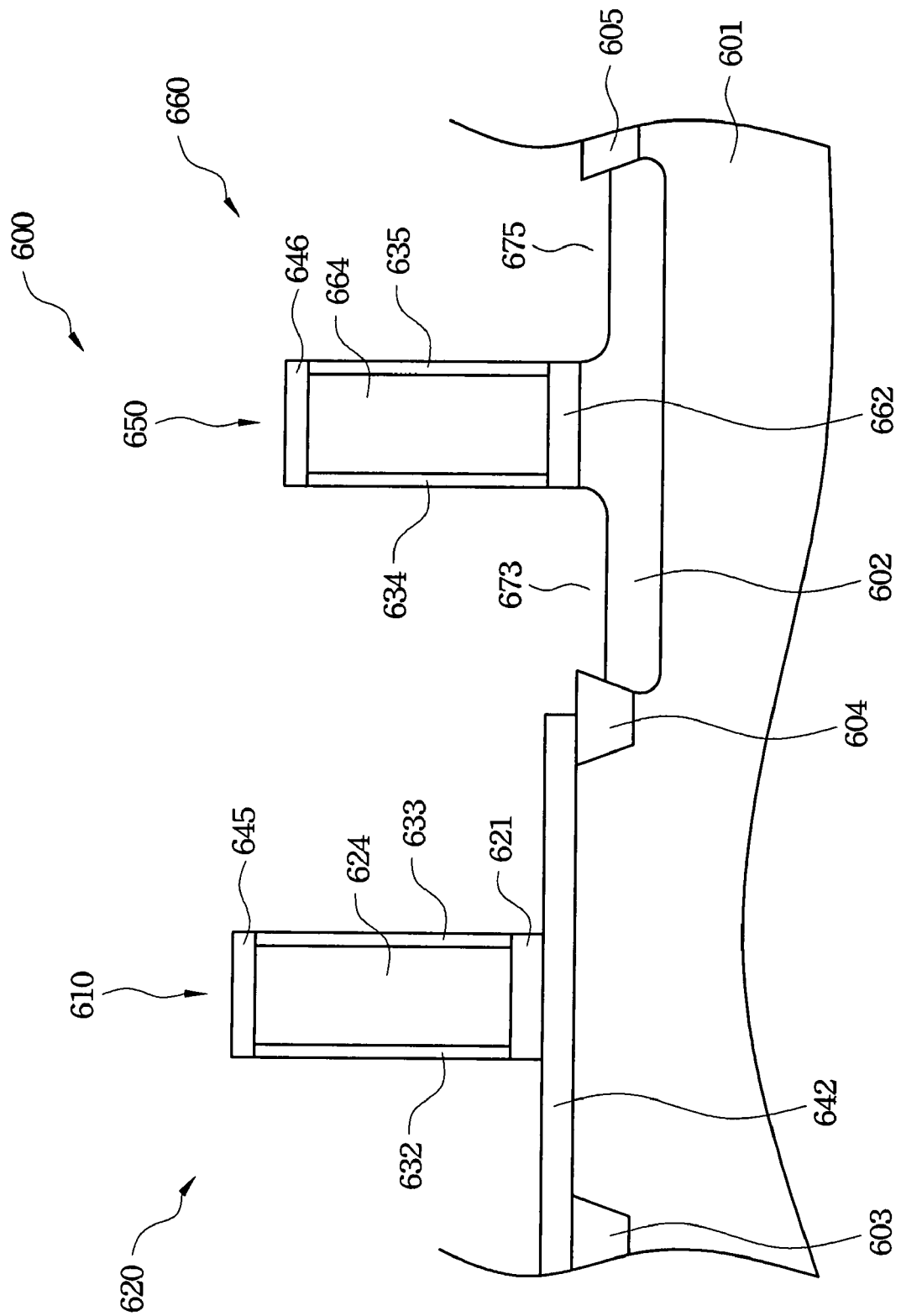

The photoresist structures 631 and 671 are then removed, and an oxide layer is formed on each of the vertical sidewalls of the gate structures. This configuration is illustrated in FIG. 6c, where oxide structures 632 through 635 are shown. As can be seen in this figure, an oxide layer 636 is also formed on the surface of the substrate n-well 602, although this oxide layer 636 will be removed, or largely removed, in the next operation. That operation is an etch process that forms recesses in the n-well 602 that will be used to accommodate formation of the source region and the drained region for the PMOS device 650. The two recesses 673 and 675 are therefore formed on either side of the gate structure 660, as shown in FIG. 6d.

Figure 6E:
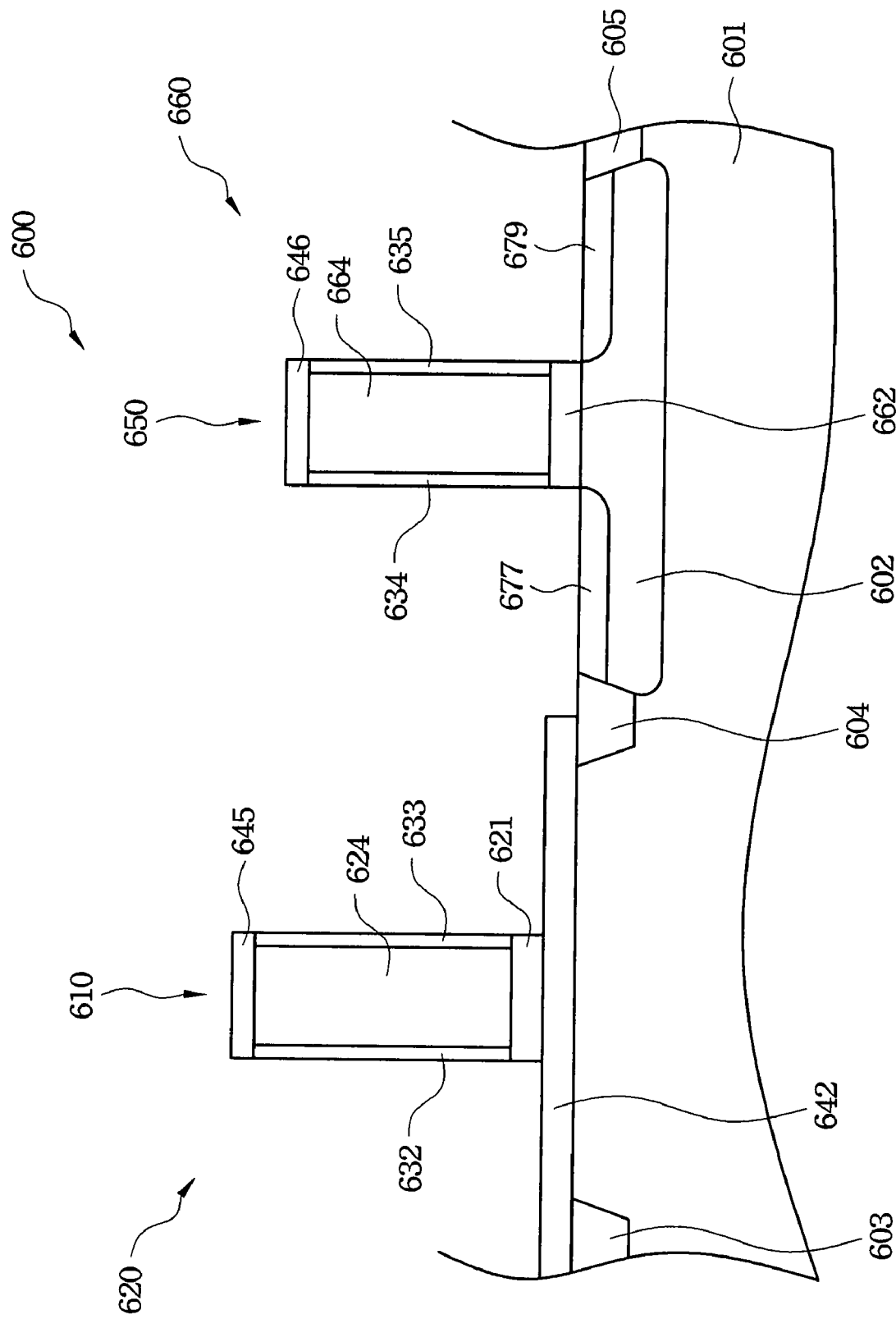

At this point, according to this embodiment, the source region 677 and the drain region 679 are formed by epitaxial growth so as to fill in the two recesses 673 and 675 just created. In one embodiment (not shown), the epitaxial growth is allowed to continue until the upper boundary of the source region 677 or the drain region 679, or both, has reached an elevation above the lower boundary of the gate structure 660. Alternately, the upper boundary of the source region 677 or the drain region 679 may be lower than the lower boundary of the gate structure 660, although this configuration is not presently preferred. In the embodiment of FIGS. 6a through 6f, the upper boundary of the source region 677 and the upper boundary of the drain region 679 are substantially coplanar with the lower boundary of the gate structure 660, as shown in FIG. 6e.

Figure 6F:
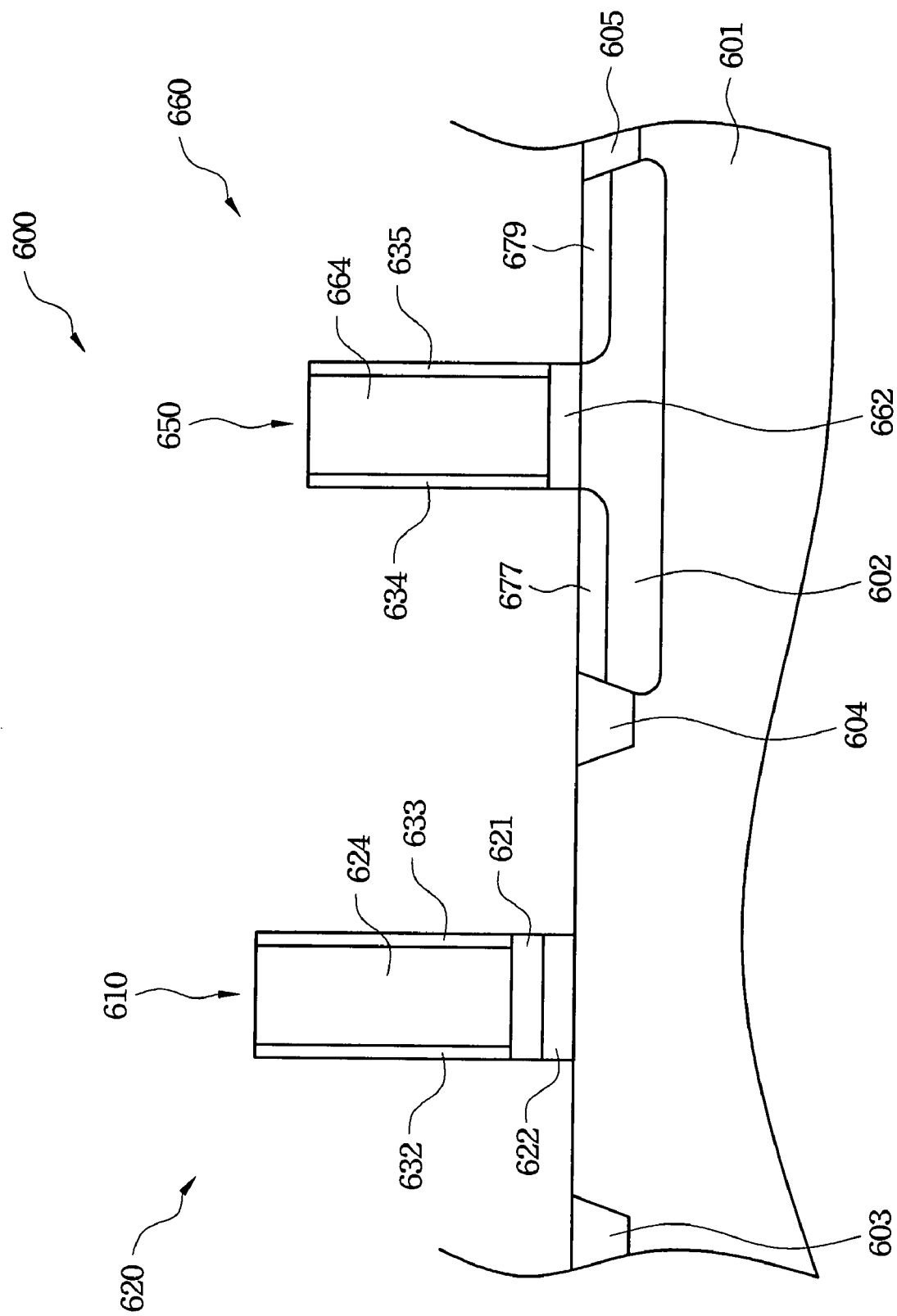

The remaining portions 645 and 646 of the cap dialectic layer are then removed, as are the remaining portions of the first dielectric layer 642 that are disposed without the gate structure 620, preferably in a two-step etching process. This configuration is illustrated in FIG. 6f. As can be seen in FIG. 6f, the previously-formed oxide layers 632 through 635 remain on the vertical sides of the poly portion of each of the respective gate structures. These may either be removed now or later as fabrication continues, but it is important to note that their presence during the process recited above results in a relatively-thin poly width for each of the gate structures 620 and 660. This is because the oxide layers, inhibiting strained epitaxial growth on the poly sidewall, are formed by consuming poly silicon. The thinner width of the gate electrode formed in this manner may provide the advantage of facilitating more strain enhancement of the silicon channel when a contact etch stop layer (not shown) is later formed. Note that this and the remaining steps in the fabrication of CMOS device 600 proceed generally from this point in a manner that is currently known in the art, or that may be later developed, and is therefore omitted from the sequence of FIGS. 6a through 6f.

Although the present invention and its advantages have been described in detail, it should be understood that various changes, substitutions and alterations can be made herein without departing from the spirit and scope of the invention as defined by the appended claims. For example, other dielectric materials may be used in substitution for those explicitly recited above. In addition, the substrate initially provided may be a either an n-substrate or a p-substrate, with appropriate modifications made to the respective other components depending on the design choice. The metal layer may be used in either of the gate structures.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a dual-gate semiconductor device, comprising:
    forming an asymmetric gate stack having a first portion and a second portion, the first portion comprising a metal layer;
    etching a second gate structure in the second portion and partially etching a first gate structure in the first portion, wherein the partial etch of the first gate structure does not remove the metal layer;
    forming a dielectric layer on at least a portion of each gate structure;
    etching recesses for a source region and a drain region adjacent the second gate structure and simultaneously removing the metal layer except that portion forming part of the first gate structure; and
    forming a source region in the source-region recess and a drain region in the drain region recess.

2. The method of claim 1, wherein the first portion of the asymmetric gate stack further comprises a first dielectric layer disposed beneath the metal layer.

3. The method of claim 2, wherein the first dielectric layer is formed of a high-k material.

4. The method of claim 3, wherein the high-k material is selected from the group $HfO_2$ or $ZrO_2$.

5. The method of claim 2, further comprising removing the high-k dielectric layer except that portion forming part of the first gate structure.

6. The method of claim 1, wherein the semiconductor device is a CMOS device.

7. The method of claim 1, wherein the source region, drain region and the second gate structure form a PMOS device.

8. The method of claim 1, wherein the source region, drain region and the second gate structure form an NMOS device.

9. The method of claim 1, wherein forming the source region and the drain region comprises epitaxial growth.

10. The method of claim 9, wherein the source region and the drain region comprise strained silicon.

11. The method of claim 10, wherein the source region and the drain region further comprise germanium.

12. The method of claim 10, wherein the source region and the drain region further comprise carbon.

13. The method of claim 1, wherein etching the gate structures is performed using HBr and $C_xF_y$ plasma.

14. The method of claim 1, wherein etching recesses for the source region and the drain region and removing the non-gate metal layer uses a plasma comprising $CH_xF_ySF_6$ (sulphur hexafluoride) and $Cl_2$ (chlorine).

* * * * *